(12) United States Patent
Aoki

(10) Patent No.: US 7,560,806 B2
(45) Date of Patent: Jul. 14, 2009

(54) MEMORY CARD

(75) Inventor: Yoshitaka Aoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 130 days.

(21) Appl. No.: 11/686,583

(22) Filed: Mar. 15, 2007

(65) Prior Publication Data
US 2007/0228536 A1   Oct. 4, 2007

(30) Foreign Application Priority Data
Mar. 29, 2006   (JP) ............................. 2006-091413

(51) Int. Cl.
| H01L 23/02 | (2006.01) |
| H01L 23/498 | (2006.01) |
| G06K 19/06 | (2006.01) |
| G06F 13/00 | (2006.01) |

(52) U.S. Cl. ............................. 257/679; 257/E23.064; 257/E23.176; 257/E25.013; 257/678; 235/492

(58) Field of Classification Search ................. 257/679, 257/678, E23.064, E23.176, E25.013; 235/492, 235/451, 482, 486, 495
See application file for complete search history.

(56) References Cited

U.S. PATENT DOCUMENTS

| 7,032,827 | B2* | 4/2006 | Wang et al. .................. 235/492 |
| 7,103,684 | B2* | 9/2006 | Chen et al. ..................... 710/62 |
| 2002/0020911 | A1 | 2/2002 | Lee et al. |
| 2004/0089717 | A1* | 5/2004 | Harari et al. ................. 235/441 |
| 2005/0279838 | A1* | 12/2005 | Wang et al. .................. 235/492 |
| 2006/0202041 | A1* | 9/2006 | Hishizawa et al. .......... 235/492 |
| 2008/0211074 | A1* | 9/2008 | Osako et al. ................. 257/679 |

FOREIGN PATENT DOCUMENTS

JP   2001-338274   12/2001

* cited by examiner

Primary Examiner—Alexander O Williams
(74) Attorney, Agent, or Firm—Oblon, Spivak, McClelland, Maier & Neustadt, P.C.

(57) ABSTRACT

A memory card includes: a package in the form of a thin plate made of an insulating material and configured to be inserted into and removed from a slot of an external apparatus; a plurality of contacts provided on the package and configured to transmit a signal to and from the external apparatus; the contacts being juxtaposed in a direction perpendicular to a loading/unloading direction, in which the memory card is loaded into or unloaded from the external apparatus, in a region of a flat face, which is one of faces of the package in a thicknesswise direction, except locations on the opposite sides in the direction perpendicular to the loading/unloading direction; and a pair of side labels adhered to the locations on the opposite sides of the upper face of the package and extending along the loading/unloading direction.

7 Claims, 4 Drawing Sheets

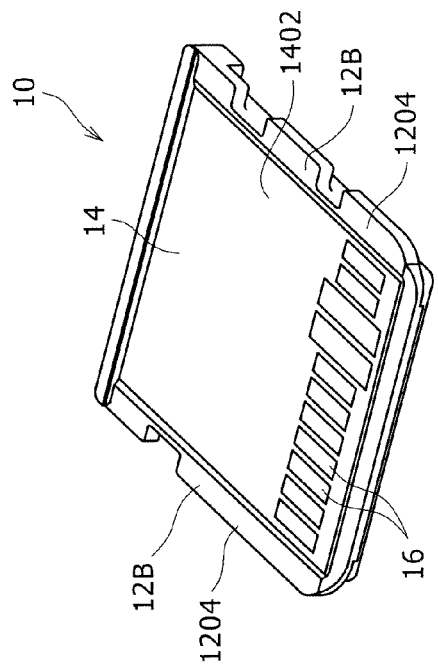
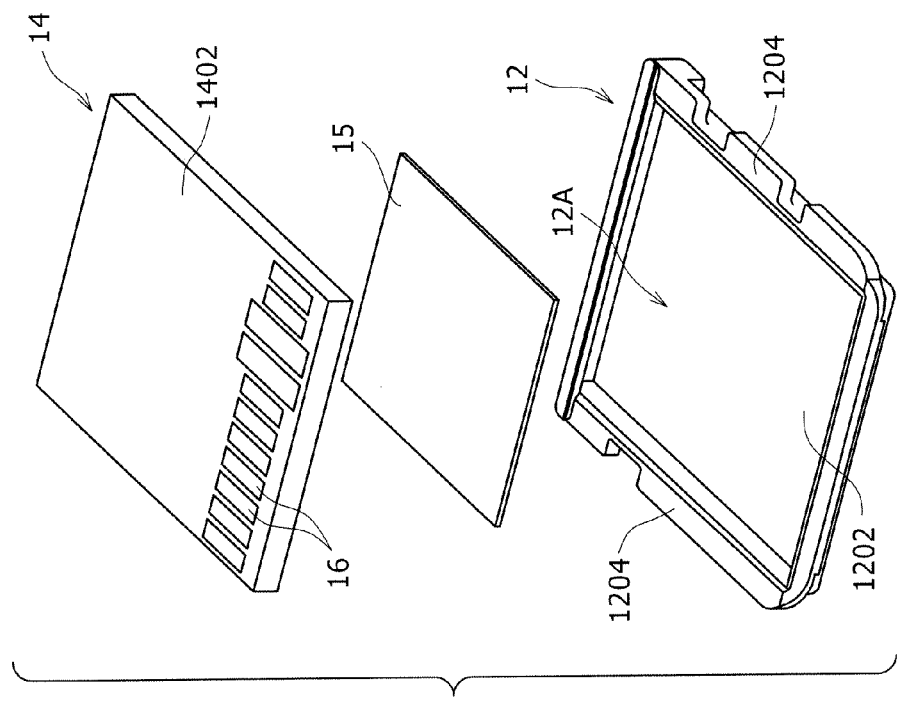
FIG. 5A
FIG. 5B

MEMORY CARD

CROSS REFERENCES TO RELATED APPLICATIONS

The present invention contains subject matter related to Japanese Patent Application JP 2006-091413 filed with the Japanese Patent Office on Mar. 29, 2006, the entire contents of which being incorporated herein by reference.

BACKGROUND OF THE INVENTION

1. Field of the Invention

This invention relates to a memory card.

2. Description of the Related Art

A memory card has been proposed already which includes a reloadable flash memory into and from which data are written and read out.

The memory card includes a package accommodated in a housing and a plurality of contacts provided on an upper face of the package for transmitting a signal to and from an external apparatus therethrough. A memory card of the type described is disclosed, for example, in Japanese Patent Laid-Open No. 2001-338274.

A memory card of the type described is produced by placing a board having a plurality of contacts thereon into a metal mold and pouring molten synthetic resin into the metal mold.

In order to assure, when the memory card is placed inversely with the upper side down on a receiving face of a desk or the like, a gap between the receiving face and the surface of the contacts to prevent dust or soil from sticking to the surface of the contacts from the receiving face, projections are provided on the opposite sides of the upper face of the package.

SUMMARY OF THE INVENTION

The configuration of the memory card described above complicates the metal mold for the package. Therefore, the memory card is disadvantageous where it is tried to achieve reduction of the cost.

Therefore, it is demanded to provide a memory card wherein a plurality of contacts for transmitting a signal to and from an external apparatus therethrough can be protected without provision of projections on an upper face of a package and which is advantageous for reduction of the cost.

According to an embodiment of the present invention, there is provided a memory card including a package in the form of a thin plate made of an insulating material and configured to be inserted into and removed from a slot of an external apparatus, a plurality of contacts provided on the package and configured to transmit a signal to and from the external apparatus therethrough, the contacts being juxtaposed in a direction perpendicular to a loading/unloading direction, in which the memory card is loaded into or unloaded from the external apparatus, in a region of a flat face, which is one of faces of the package in a thicknesswise direction, except locations on the opposite sides in the direction perpendicular to the loading/unloading direction, and a pair of side labels adhered to the locations on the opposite sides of the upper face of the package and extending along the loading/unloading direction.

With the memory card, such a simple configuration as provision of the side labels is used to provide locations higher than the surface of the contacts on the package to achieve protection of the contacts. Consequently, the memory card can be produced at a reduced cost.

BRIEF DESCRIPTION OF THE DRAWINGS

FIGS. 5A and 5B are an exploded perspective view and a perspective view, respectively, showing a memory card which has been proposed by the assignee of the present application.

DETAILED DESCRIPTION OF THE PREFERRED EMBODIMENT

Figure 1:
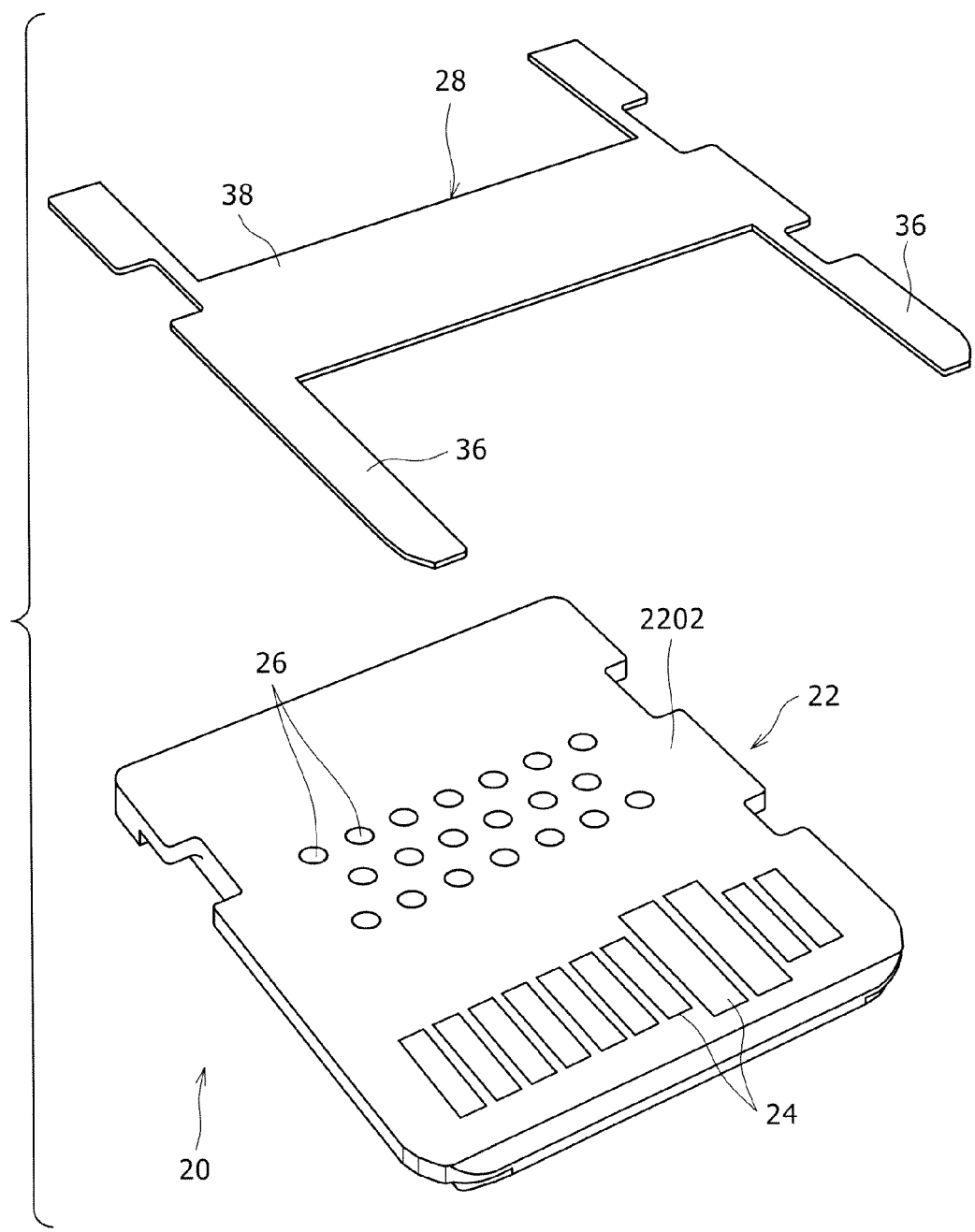
FIG. 1 is an exploded perspective view of a memory card to which the present invention is applied.

First, in order to facilitate the understandings of the present invention, a memory card which has been proposed by the assignee of the present application is described briefly.

Referring to FIG. 5A, the memory card mentioned is generally formed as a rectangular thin plate and includes a housing 12 made of an insulating material and having a recess 12A formed on an upper face which is one of the opposite faces in a thicknesswise direction, and a rectangular package 14 accommodated in the recess 12A.

The housing 12 has a rectangular bottom wall 1202, and side walls 1204 extending uprightly from the four sides of the bottom wall 1202. The recess 12A is defined by the bottom wall 1202 and the four side walls 1204 and is open upwardly.

The package 14 extends over an overall area of the bottom wall 1202 in the recess 12A and secured to the bottom wall 1202 through a double-sided adhesive tape 15 thereby to form the memory card 10 shown in FIG. 5B.

The package 14 has an upper face formed as a flat face 1402, and a plurality of contacts 16 for transmitting a signal to and from an external apparatus are provided on the flat face 1402.

The contacts 16 are juxtaposed in a direction perpendicular to a loading/unloading direction in which the memory card 10 is loaded into and unloaded from the external apparatus. The surface of the contacts 16 and the flat face 1402 are positioned in a substantially same plane.

As seen in FIG. 5B, two opposing ones of the side walls 1204 of the housing 12 are positioned at the opposite side locations of the upper face of the package 14 in the direction perpendicular to the loading/unloading direction of the memory card 10. The upper ends of the side walls 1204 in the thicknesswise direction of the package 14 form projections 12B which are positioned higher than the surface of the flat face 1402 and the surface of the contacts 16 and extend along the loading/unloading direction of the memory card 10.

Where the memory card 10 having the configuration described above is placed on a receiving face of a desk or the like, the projections 12B contact with the receiving face. Therefore, a gap is assured between the receiving face and the surface of the contacts 16. Consequently, dust or soil is prevented from sticking to the surface of the contacts 16 from the receiving face.

Now, a memory card to which the present invention is described with reference to FIGS. 1 to 4.

It is to be noted here that the memory card 10 described above corresponds to the Memory Stick Micro (registered trademark of Sony Corporation).

Referring first to FIG. 1, a memory card 20 to which the present invention is applied does not include the housing 12 but includes a package 22. In this regard, the memory card 20 already achieves reduction of the cost.

The package 22 includes a plurality of contacts 24, a plurality of test terminals 26, and a contact protecting label 28.

The package 22 is formed as a thin plate of an insulating material and is inserted into and removed from a slot of an external apparatus. The insulating material may be a thermosetting resin such as, for example, an epoxy resin which contains glass fibers.

The package 22 has a rectangular shape having a length extending along a loading/unloading direction in which the memory card 20 is loaded into and unloaded from the external apparatus and a width extending along a direction perpendicular to the direction of the length. The package 22 has a flat upper face 2202 formed on one of the opposite faces in the thicknesswise direction thereof.

The contacts 24 are juxtaposed in a direction perpendicular to the loading/unloading direction of the memory card 20 in a region of the upper face 2202 except the opposite side locations in the direction perpendicular to the loading/unloading direction of the memory card 20.

The test terminals 26 are provided at locations of the upper face 2202 of the package 22 spaced from the contacts 24, in the present embodiment, in a substantially rectangular region which extends along the widthwise direction except the opposite side locations at an intermediate portion of the upper face 2202 of the package 22 in the lengthwise direction.

Further, an inclined face 2210 is provided at an end in the lengthwise direction of the upper face 2202 on which the contacts 24 are provided. The inclined face 2210 has a height which decreases toward the end of the upper face 2202 of the package 22 so as to facilitate insertion of the memory card 20 into the slot of the external apparatus.

Figure 4:
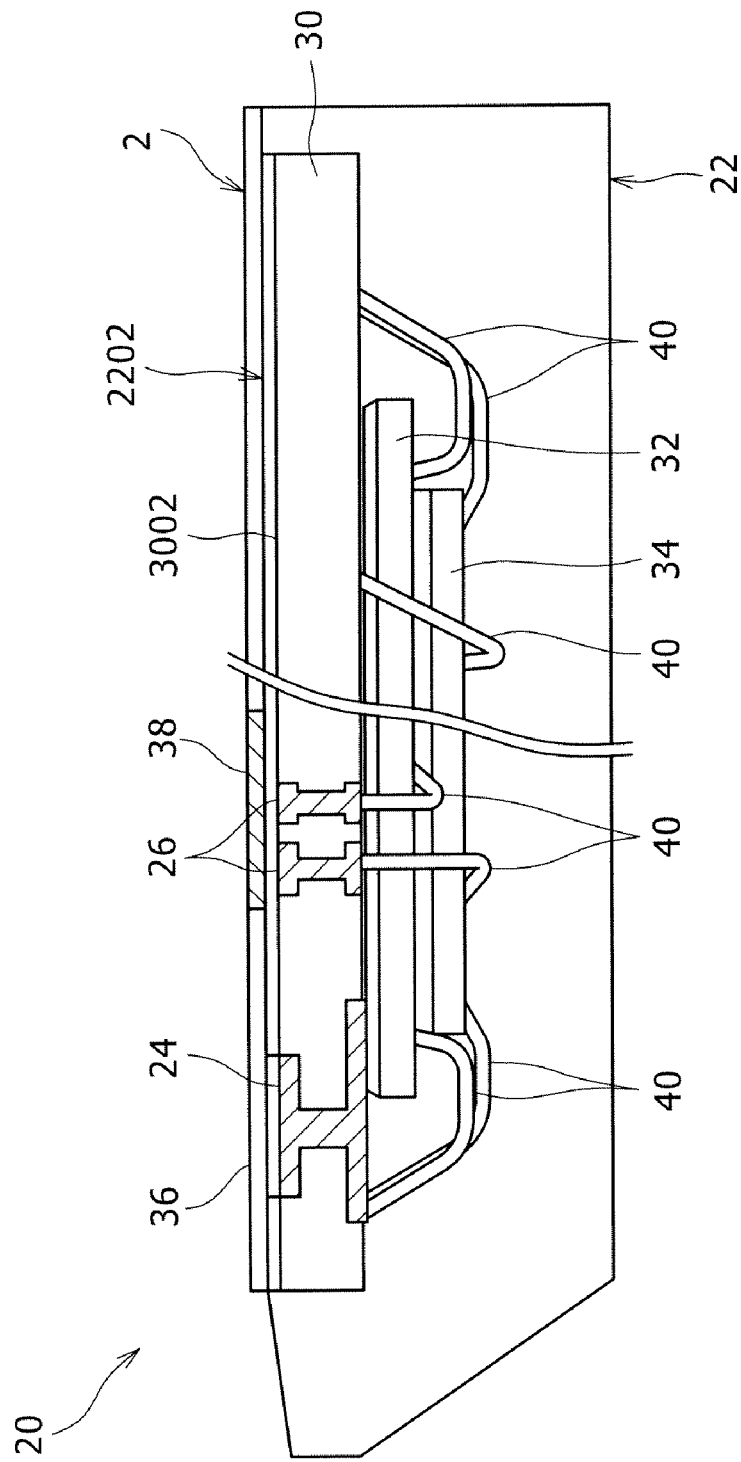
FIG. 4 is a sectional view taken along line B-B of FIG. 2.

Referring now to FIG. 4, the package 22 includes a board 30, a storage section 32, and a controller 34.

The board 30 is formed as a rectangular thin plate of an insulating material and has conductor patterns formed on the surface or in the inside thereof. The board 30 is positioned on the upper face 2202 of the package 22.

The storage section 32 is attached to the lower face of the board 30 and embedded in the package 22. The storage section 32 is configured such that data can be written into and/or read out from the same. In the present embodiment, the storage section 32 is formed from a reloadable flash memory.

The contacts 24 and the test terminals 26 are provided on the upper face 2202 of the package 22. More particularly, the board 30 is embedded in the package 22 except the upper face thereof, and the contacts 24 are formed so as to extend from the upper face to the lower face of and through the board 30. The surface (upper face) of the board 30 is covered with a resist layer 3002 of an insulating material, and the board 30 is perforated at portions thereof corresponding to the contacts 24 and the test terminals 26. The contacts 24 and the test terminals 26 are exposed to the outside through the perforations. Accordingly, in the present embodiment, the surface of the resist layer 3002 forms part of the upper face 2202 of the package 22.

The controller 34 is embedded in the package 22 and communicates data with the external apparatus through the contacts 24 to write and/or read out data into and/or from the storage section 32. While the controller 34 in the present embodiment is embedded at a location of the package 22 above the storage section 32, the controller 34 may otherwise be embedded at another location of the package 22 above the board 30.

Some of the test terminals 26 are connected directly to the storage section 32 while the remaining ones of the test terminals 26 are connected directly to the controller 34.

It is to be noted that the test terminals 26 are used to test the storage section 32 and the controller 34 solely and independently of each other. Such tests are performed, for example, upon inspection before shipment or upon failure analysis after shipment.

More particularly, a testing apparatus known in the past is used to operate the storage section 32 solely through the test terminals 26 directly connected to the storage section 32 and analyze the operation of the storage section 32 to perform a test of the operation state of the storage section 32.

Meanwhile, an external testing apparatus is used to operate the controller 34 solely through the test terminals 26 directly connected to the controller 34 and analyze the operation of the controller 34 to perform a test of the operation state of the controller 34.

It is to be noted that the storage section 32 and the associated patterns of the board 30, the controller 34 and the associated patterns of the board 30, the storage section 32 and the associated contacts 24, the controller 34 and the associated contacts 24, the storage section 32 and the associated test terminals 26, and the controller 34 and the associated test terminals 26 are electrically connected to each other by respective bonding wires 40.

The contact protecting label 28 is provided such that, when the memory card 20 is placed inversely with the upper side down on a receiving face of a desk or the like, it contacts with the receiving face to assure a gap between the receiving face and the surface of the contacts 24. Consequently, dust or soil is prevented from sticking to the surface of the contacts 24 from the receiving face.

Referring back to FIG. 1, the contact protecting label 28 is formed from a material having an insulating property. In the present embodiment, the contact protecting label 28 includes two side labels 36 and a connection label 38.

Figure 2:
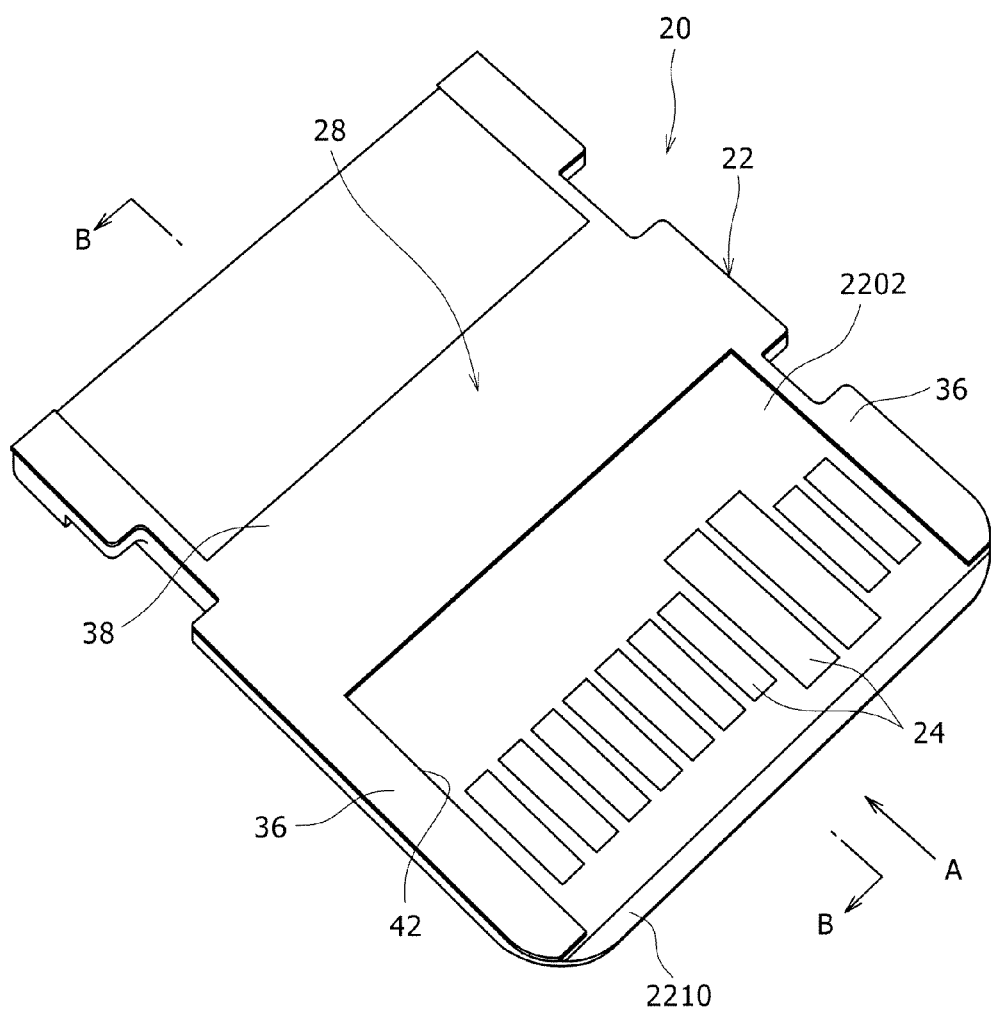
FIG. 2 is a perspective view of the memory card in an assembled form.
Figure 3:
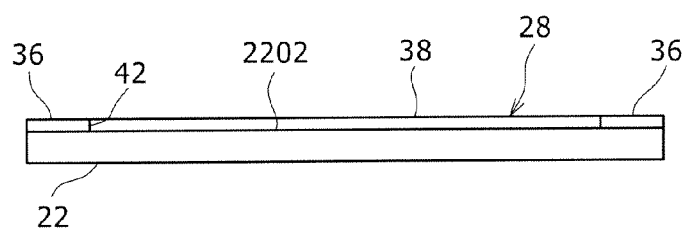
FIG. 3 is a view as viewed in the direction indicated by an arrow mark A in FIG. 2.

Referring to FIGS. 2, 3 and 4, the contacts 24 are not provided on the opposite side locations of the upper face 2202 of the package 22 in the direction perpendicular to the loading/unloading direction in which the package 22 is loaded into and unloaded from the external apparatus. The side labels 36 of the contact protecting label 28 extend along the loading/unloading direction of the memory card 20 at the opposite side locations of the upper face 2202 of the package 22 and are adhered to the opposite side locations.

Meanwhile, the connection label 38 extends in the direction perpendicular to the loading/unloading direction and connects the side labels 36 on the opposite sides to each other. The connection label 38 is adhered to a location of the upper face 2202 spaced away from the contacts 24. In the present embodiment, the connection label 38 covers the test terminals 26.

It is to be noted that adhesion of the two side labels 36 and the connection label 38 to the upper face 2202 of the package 22 is performed using a double-sided adhesive tape known in the past or an adhesive layer. For the double-side adhesive tape or the adhesive layer, a product of the pressure sensitive type which exhibits adhesive force through pressurization, a product of the heat sensitive type which exhibits adhesive force through heating or a like product may be adopted.

Referring to FIG. 2, the side labels 36 on the opposite sides and the connection label 38 of the contact protecting label 28 define an opening 42 which is open to one of the lengthwise directions of the package 22 on which the contacts 24 are provided. The opening 42 allows the contacts 24 to be exposed therethrough.

Then, as the contact protecting label 28 is adhered to the upper face 2202, the surface of the side labels 36 and the connection label 38 is positioned higher than the surface of the contacts 24 in the thicknesswise direction of the package 22.

According to the present embodiment, the memory card 20 is composed of the package 22 without using a housing. This is advantageous when it is tried to achieve reduction of the cost of the memory card 20.

Further, protection of the contacts 24 can be achieved by the simple configuration that the contact protecting label 28 is used without forming projections in a swollen manner at locations on the opposite sides of the package 22. Also this is advantageous when it is tried to achieve reduction of the cost of the memory card 20.

Particularly in the present embodiment, since the contact protecting label 28 which covers the test terminals 26 is utilized, increase of the number of parts is suppressed. Also this is advantageous when it is tried to achieve reduction of the cost of the memory card 20.

It is to be noted that, while the contact protecting label 28 in the present embodiment includes the two side labels 36 and the connection label 38, the connection label 38 may be omitted. It is to be noted, however, that use of the connection label 38 is advantageous in that the contact protecting label 28 can be adhered simply.

Further, the location and the size of the connection label 38 are optional. For example, the connection label 38 may be provided so as to connect intermediate portions of the side labels 36 on the opposite sides in the extension direction as in the case of the embodiment. Or, the connection label 38 may be provided so as to cover the overall region of the upper face 2202 except the locations at which the contacts 24 are provided. Anyway, where the connection label 38 is provided, the adhesion location thereof should be displaced from the locations at which the contacts 24 are provided such that at least the locations at which the contacts 24 are provided are exposed.

Further, while the memory card 10 in the embodiment is the Memory Stick Micro, the form of the memory card 10 is not limited to this.

Further, while the storage section 32 in the embodiment is a reloadable flash memory, the storage section 32 in the present invention is not limited to this but may be any storage section into and/or from which data can be written and/or read out.

While a preferred embodiment of the present invention has been described using specific terms, such description is for illustrative purposes only, and it is to be understood that changes and variations may be made without departing from the spirit or scope of the following claims.

What is claimed is:

1. A memory card, comprising:
    a package in the form of a thin plate having a first end and a second end, the package made of an insulating material and configured to be inserted into and removed from a slot of an external apparatus;
    a plurality of contacts provided on said package near the first end and configured to transmit a signal to and from the external apparatus;
    said contacts being juxtaposed in a direction perpendicular to a loading/unloading direction, in which said memory card is loaded into or unloaded from the external apparatus, in a region of a flat face, which is one of faces of said package in a thickness wise direction, except locations on the opposite sides in the direction perpendicular to the loading/unloading direction;
    a pair of side labels adhered to the locations on the opposite sides of the upper face of said package so that an edge of each of the side labels is coplanar with a side edge of the package and the pair of side labels extend along an entire length of the package in the loading/unloading direction; and
    a connection label adhered to a middle portion of the upper face of said package spaced apart from said contacts and the second end, the connection label positioned higher than the contacts and extending in the direction perpendicular to the loading/unloading direction to connect said side labels on the opposite sides to each other.

2. The memory card according to claim 1, wherein said side labels and said connection label cooperatively form a contact protecting label.

3. The memory card according to claim 1, wherein said side labels and said connection label cooperatively form a contact protecting label, and said side labels and said connection label of said contact protecting label define an opening through which said contacts are exposed.

4. The memory card according to claim 1, further comprising:
    a storage section and a controller provided in the inside of said package, said controller being configured to control said storage section; and
    a plurality of test terminals provided at locations of the upper face of said package spaced from said contacts and individually connected to said storage section and said controller;
    said test terminals being covered with said connection label.

5. The memory card according to claim 1, wherein said connection label is provided so as to cover the entire region of the upper face of said package except the locations at which said contacts are provided.

6. The memory card according to claim 1, wherein said package has a rectangular shape having a length extending in the loading/unloading direction and a width extending in the direction perpendicular to the lengthwise direction, and said contacts are provided at the locations of the upper face of said package which are positioned at an end portion of said package in the lengthwise direction.

7. The memory card according to claim 1, wherein the surface of said side labels is positioned higher than the surface of said contacts in the thickness wise direction of said package.

\* \* \* \* \*